United States Patent [19]
Ernst

[11] 4,134,058
[45] Jan. 9, 1979

[54] SELECTIVE DETECTION OF MULTIPLE QUANTUM TRANSITIONS IN NUCLEAR MAGNETIC RESONANCE

[75] Inventor: Richard R. Ernst, Winterthur, Switzerland

[73] Assignee: Varian Associates, Inc., Palo Alto, Calif.

[21] Appl. No.: 855,508

[22] Filed: Nov. 28, 1977

[51] Int. Cl.² ............................................. G01R 33/08
[52] U.S. Cl. .............................. 324/0.5 A; 324/0.5 R
[58] Field of Search ........... 324/0.5 R, 0.5 A, 0.5 AC

[56] References Cited

U.S. PATENT DOCUMENTS

| 4,045,723 | 8/1977 | Ernst | 324/0.5 R |
| 4,068,161 | 1/1978 | Ernst | 324/0.5 R |

Primary Examiner—M. Tokar
Attorney, Agent, or Firm—Stanley Z. Cole; Edward H. Berkowitz

[57] ABSTRACT

Selected orders of multiple quantum transitions may be detected by preparing a statistical non-equilibrium state of an assembly of gyromagnetic resonators of selected phase with respect to a subsequent mixing pulse. After an evolution period, $t_1$, a 90° mixing pulse is applied and the free induction decay is sampled as a function of time, $t_2$. The signal functions $S_i(t_1, t_2, \phi_i)$ is developed for systematically varied values of $t_1$ and specially selected values of $\phi_i$. Linear combinations of the signal functions $S_i$ yield, after Fourier transformation a two dimensional spectrum of multiple quantum transitions limited by the choice of phase and linear combination. In another embodiment, a magnetic gradient pulse is applied during the evolution period and resulting multiple quantum transitions yield spectral peaks of width dependent upon the order of such transitions. In particular, all spectral peaks may be removed from resulting spectra save only zero order transitions.

11 Claims, 4 Drawing Figures

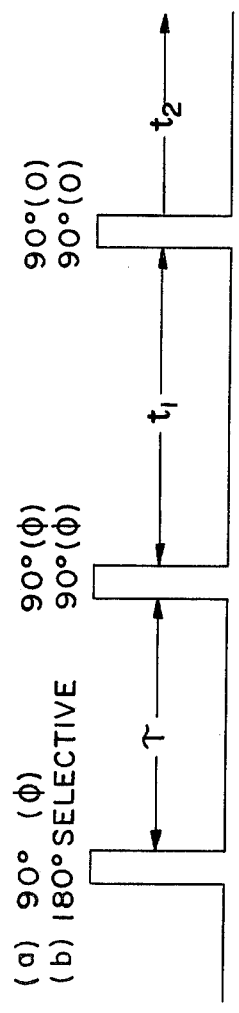
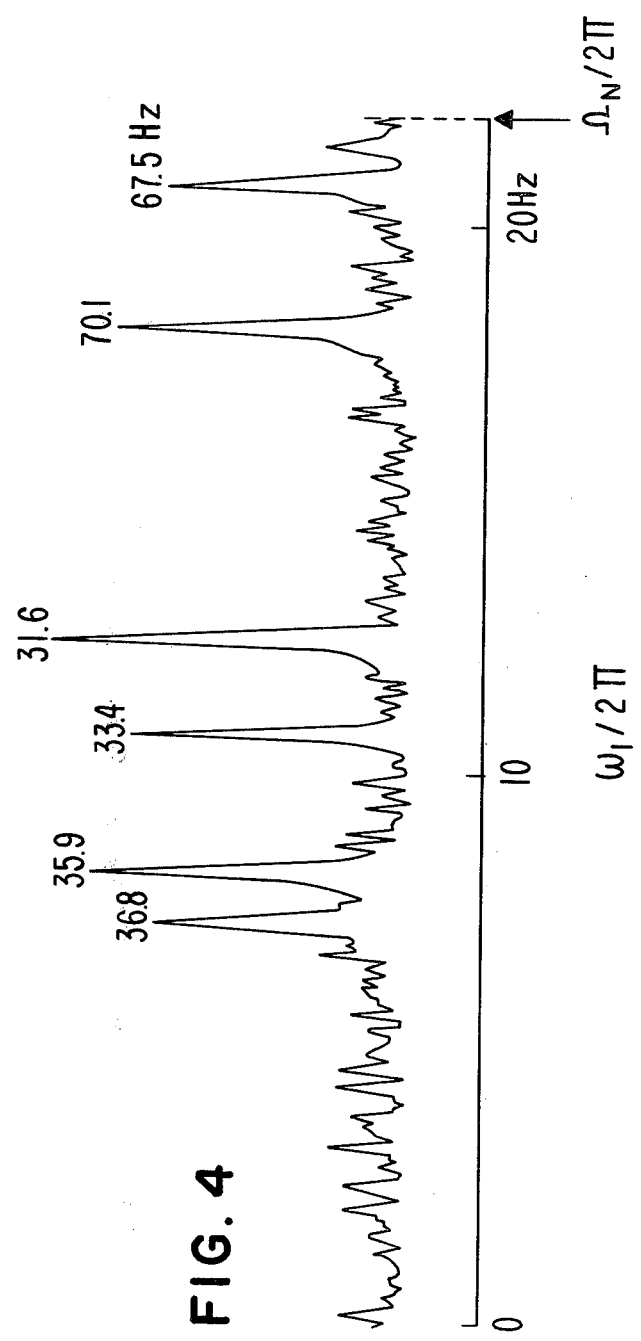
FIG. 1
FIG. 4

SELECTIVE DETECTION OF MULTIPLE QUANTUM TRANSITIONS IN NUCLEAR MAGNETIC RESONANCE

BACKGROUND OF THE INVENTION

The present invention relates to magnetic resonance apparatus and method and particularly to selective detection of multiple quantum transitions.

Most magnetic resonance experiments are confined to the observation of single quantum transitions which obey the selection rule $$\Delta M = \pm 1$$

where M is the total magnetic quantum number of the resonant system. This selection rule holds for all low power experiments as a consequence of first order time-dependent perturbation theory. Transitions for which the change in magnetic quantum number are other than $\pm 1$ are said to be "forbidden" because such transition probabilities calculated in first order time-dependent perturbation theory vanish. Of course, such calculations are merely first order approximations and it is found that such transitions do occur, albeit at greatly reduced intensity relative to the more common single quantum transitions. These high order transitions physically are associated with an event requiring simultaneous absorption of a plurality of radiation quanta.

In Fourier transform experiments where the free induction decay is recorded in the absence of RF irradiation, it is not possible to directly detect multiple quantum transitions (MQT) because the corresponding matrix elements of these transitions are absent in the observable operators which account for the transitions. In certain other experimental situations, it is possible to excite and observe multiple quantum transitions. For example, in slow passage experiments, higher order transitions are known to be induced whenever the applied RF field is sufficiently strong. The intensity of a p-quantum transitions will then depend on a term of the form $(\gamma H_1)^{2p-1}$ where gamma is the coupling constant and $H_1$ is the term representative of the perturbation. In such a fashion, a certain course discrimination may be imposed for a particular order of transitions given the experimental sensitivity of the apparatus.

Aue, Bartholdi and Ernst, J. Chem. Phys., Vol. 64 pp. 22-29 22-46 (1976) have shown that multidimensional Fourier spectroscopy techniques could render observable by indirect means multiple (including 0) quantum transitions. This work did not, however, prescribe technique for the observation of particular selected orders of such transitions.

It is useful to note that the observation of multiple quantum transitions is advantageous in obtaining a simplification of otherwise highly complex spectra. Non-degenerate MQT's exhibit exponential relaxation for which the relaxation parameters are obtainable in a simple manner with very high accuracy. Moreover, a special case, that of zero quantum transitions, are known to be insensitive to magnetic field inhomogeneity and thereby permit the recording of high resolution spectra inhomogeneous magnetic fields.

It is known that MQT's can be excited by an intense and selective RF pulse designed to excite a particular MQT or group of MQT's, and the matrix elements of such transitions can be generated theoretically in analogy to single quantum transition matrix elements. This procedure has been extensively used in deuterium double quantum spectroscopy. However, this approach requires some advance knowledge about the investigated system in order to permit such selective excitation.

It is also known that non-equilibrium states may be employed advantageously for the excitation of MQT's. Non-equilibrium states of either the first or second kind will in general lead to non-zero matrix elements of all possible orders of MQT's. Such non-equilibrium states are characterized by populations of the energy levels of the system which deviate from a Boltzmann of distribution. A non-equilibrium state of the first kind is one wherein the density operator for the system commutes with the unperturbed Hamiltonian that is $$[\sigma, H] = 0$$

Whereas a non-equilibrium state of the second kind is one wherein the density operator and unperturbed Hamiltonian are non-commutative resulting in a density matrix with non-vanishing off diagonal elements. Aue, Bartholdi, and Ernst have shown that for magnetic resonance experiments a non-equilibrium state of the first kind may be created by inversion of a single quantum transition through a selective 180 degree pulse followed after an interval by an non-selective 90 degree pulse. The same authors have also described creation of a non-equilibrium state of the second kind through application of a non-selective 90 degree pulse followed by a precession period of length $\tau$, comparable to some relevant inverse precession frequency differences $\Delta\omega \sim 1/\tau$, thereafter followed by a second 90 degree pulse. It is noted that techniques which create non-equilibrium states of either kind will usually result in an unequal population of the various MQT matrix elements resulting in unequal intensities in the final MQT spectrum.

Specifically, Aue, Bartholdi and Ernst describe a general scheme for the detection of forbidden transitions utilizing techniques of two dimensional spectroscopy. The preparation period, $t < 0$ is defined during which the density operator describes population of the corresponding off-diagonal matrix elements of the various transitions. There follows an evolution period, $0 < t < t_1$, during which the MQT matrix elements are permitted to evolve in time under the influence of the unperturbed Hamiltonian, H. At the time $t = t_1$, a mixing pulse t $(\alpha)$, characterized by rotation angle 90°, is applied to transform the unobservable MQT matrix elements into observable single quantum transition matrix elements. During the detection period, $t_2 > t_1$ the transverse magnetization is observed as a function of the time $t_2$ measured with respect to the occurrence of the mixing pulse at $t_1$. The experiment is repeated with the length of the evolution interval systematically varied. As a result, a two dimensional signal function s $(t_1, t_2)$ is obtained and Fourier transformed in two dimensions to the frequency domain resulting in the two dimensional function S $(\omega_1, \omega_2)$. The desired multiple quantum transition data is thus distributed along the $\omega_1$ axis. To obtain a one dimensional multiple quantum transition spectrum, it is only necessary to project the two dimensional spectrum onto the $\omega_1$ axis.

SUMMARY OF THE INVENTION

It is an object of the present invention to selectively acquire spectral data of multiple quantum transitions between sub-levels differing in total magnetic quantum number by an amount other than unity.

It is another object to selectively acquire any desired order of multiple quantum transitions in the acquisition of magnetic resonance spectra.

It is a feature of this invention to selectively acquire spectra of multiple quantum transitions by application of RF energy of a first specified phase resulting in a non-equilibrium state, followed by the application of a 90 degree mixing pulse of RF energy characterized by reference phase at a time $t_1$ after such preparation is completed, followed by detection of free induction decay of such resonances whereby two dimensional data s ($t_1$, $t_2$) is acquired.

It is an alternative feature of the present invention to distinguish order transitions by the response of multiple quantum transitions to progressive magnetic field inhomogeneity.

Selection of particular orders or groups of orders of multiple quantum transitions are accomplished in the present invention by phase shifting the initial conditions described by $\sigma$ (0, $\phi$) of the RF pulses used to create the initial non-equilibrium state described by the density operator $\sigma$ (0).

These features are accomplished in the present invention by phase shifting the preparation period RF pulse energy with respect to the mixing pulse by an amount, $\phi$, which phase in part determines the order or group of orders of transitions to be detected in accord with a further Fourier decomposition of the observed magnetization as a function of the phase variable $\phi$. Linear combinations of the data S ($t_1$, $t_2$, $\phi$) for appropriately chosen values of $\phi$ yield two dimensional spectra wherein the orders of multiple quantum transitions are conveniently constrained.

Zero quantum transitions are distinguished from transitions of higher order by a straightforward comparison of the resonance parameters under conditions of magnetic field inhomogeneity.

BRIEF DESCRIPTION OF THE FIGURES

FIG. 1 is a pulse sequence for observing MQT's from a non-equilibrium statistical state.

FIG. 4 is a zero quantum transition spectrum of the AMX system of FIG. 1.

DETAILED DESCRIPTION OF THE PRESENT INVENTION

Figure 2:
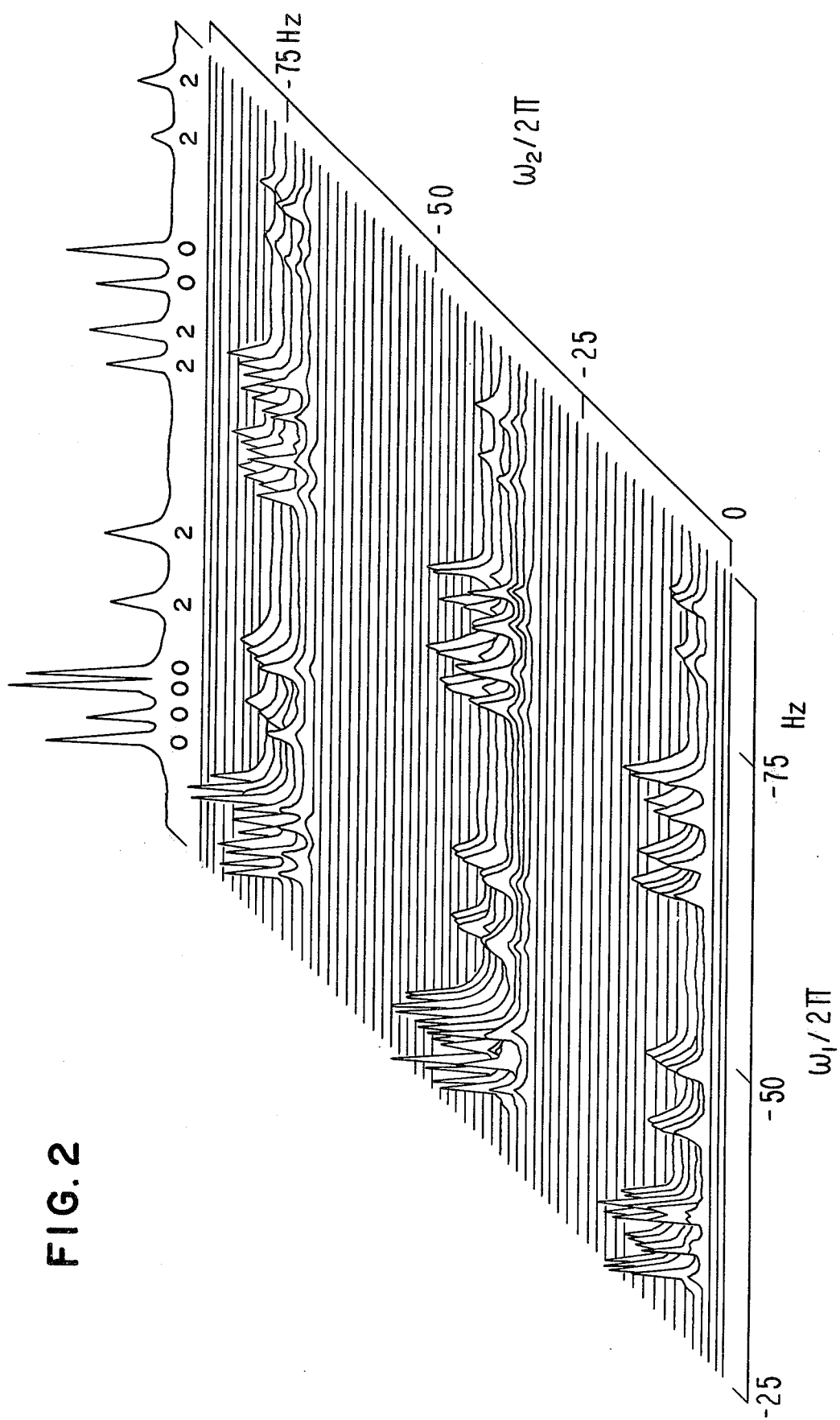
FIG. 2 is a two dimensional spectrum and projection of 0 and 2 quantum transitions in the AMX system of 2-furancarboxylic acid methyl ester.

The method of the present invention is compactly represented by the pulse sequences illustrated in FIG. 1. These pulse sequences describe the creation of non-equilibrium statistical states of the first and second kinds, for the labeled a and b respectively. As created at $t=0$, the state in the first embodiment is characterized by a phase shift by angle $\phi$ with respect to the phase of the mixing pulse. The 90° mixing pulse is applied after allowing the time dependent matrix elements of the MQT's to evolve for a period marked by $t_1$. Following this evolution period, the free induction decay is sampled as a function of time $t_2$ measured with respect to $t_1$. This procedure is repeated for systematic variation of $t_1$ whereby a three parameter response function s ($t_1$, $t_2$, $\phi$)

is developed. Appropriate linear combinations for selected phases $\phi_i$ are formed for these data as described below and double Fourier transformed to the frequency domain. The processing of similar pulsed magnetic resonance experiments from which two dimensional spectra are derived is described in detail in U.S. Pat. No. 4,045,723.

In order to ascertain the proper choice of phase for selective detection of spectra corresponding to a given order of MQT, it is necessary to consider the theoretical basis for the selectivity imposed on the detection process.

The statistical state of a spin system may be described generally in a time dependent density operator formalism represented by a decomposition into a sum of terms, each corresponding to transitions of a particular order p. Thus, $$\sigma(t) = \sum_{p=-\Delta}^{\Delta} \sigma_p(t) \qquad \text{Equ. 1}$$

The summation index is bounded by the maximum possible change of magnetic quantum number for the spin system considered. Thus a system of N spin ½ particles may be coupled to align all spins in a mutually parallel attitude to yield $N \times |1| = \Delta$. Each term in the sum corresponds to an irreducible representation of the one dimensional rotation group having the infinitesimal generator.

$$F_z = \sum_k I_{z,k}$$

By definition, the irreducible operators $\sigma_p$ transform under rotation through an angle $\phi$ as $$e^{-i\phi F_z} \sigma_p e^{i\phi F_z} = \sigma_p e^{-ip\phi} \qquad \text{Equ. 2}$$

The magnetization $M_y$ ($t_1$, $t_2$) observed in a two dimensional magnetic resonance experiment can be represented in this formalism as $$M_y(t_1, t_2) = \qquad \text{Equ. 3}$$
$$\sum_{p=-\Delta}^{\Delta} Tr\{F_y e^{-iHt_2} P(\alpha) e^{-iHt_1} \sigma_p(o) e^{iHt_1} P(\alpha)^{-1} e^{iHt_2}\}$$

where P ($\alpha$) is an operator representation of the effect of the mixing pulse of rotation angle $\alpha$ which transforms the unobservable MQT elements to observable single quantum transition elements.

In the present invention, the initial condition is parameterized by a phase constraint whereby $$\sigma(o, \phi) = e^{-i\phi F_z} \sigma(o) e^{i\phi F_z} = \sum_{p=-\Delta}^{\Delta} \sigma_p(o) e^{ip\phi} \qquad \text{Equ. 4}$$

When the phase-shifted initial condition density operator replaces $\sigma_p(0)$ of equation 3, one obtains $$M_y(t_1, t_2, \phi) = \qquad \text{Equ. 5}$$
$$\sum_{p=-\Delta}^{\Delta} Tr\{F_y e^{-iHt_2} P(\alpha) e^{-iHt_1} \sigma_p(o) e^{iHt_1} P(\alpha)^1 e^{iHt_2}\} e^{-ip\phi}$$

Equation 5 may be regarded as a Fourier series expansion in the phase variable $\phi$. One may then define the Fourier coefficients $$M_y^{(p)}(t_1,t_2) = Tr\{F_y e^{-iHt_2} P(\alpha) e^{-iHt_1} \sigma_p(o) e^{iHt_1} P(\alpha)^{-1} e^{iHt_2}\}$$

which represent response signals of various orders. Returning to equation 5, one may separate real and imaginery parts thereof, obtaining $$M_y(t_1,t_2,\phi) = M_y^{(o)}(t_1,t_2) + \sum_{p=-\Delta}^{\Delta} R_y^{(p)}(t_1,t_2)\cos(p\phi) + \sum_{p=-\Delta}^{\Delta} i_y^{(p)}(t_1 t_2)$$

Where $R_y^{(p)SIM(P\phi)}$ and $I_y^{(p)}$ represent real and imaginery amplitudes for the transverse magnetization $M_y$. By Fourier analysis in the phase angle $\phi$ one obtains $$R_y^{(p)}(t_1,t_2) = \frac{1}{2\Delta} \sum_{q=o}^{2\Delta-1} M_y(t_1,t_2,\frac{\pi q}{\Delta}) \cos(\frac{\pi qp}{\Delta})$$

$$I_y^{(p)}(t_1,t_2) = \frac{1}{2\Delta} \sum_{q=o}^{2\Delta-1} M_y(t_1,t_2,\frac{\pi q}{\Delta}) \sin(\frac{\pi qp}{\Delta})$$

If $2\Delta$ complete response arrays $M_y(t_1, t_2, \phi)$ are obtained for values of $$\phi = o, \frac{\pi}{\Delta} \cdots \frac{\pi(2\Delta-1)}{\Delta},$$

upon suitable linear combination, the various orders will be completely separated. The number of terms (and corresponding values of $\phi$) may be substantially less than a complete set while yet obtaining a limited but still useful selectivity. Table I lists several examples for choice of phase and number of terms.

TABLE I

| Values for Co-Added Experiments* | | | | | | Selected Order | | | | | | |
|---|---|---|---|---|---|---|---|---|---|---|---|---|
| 0° | | | | | | 0 | 1 | 2 | 3 | 4 | 5 | 6 .... non-selective) |
| 0° | 180 | | | | | 0 | | 2 | | 4 | | 6  8 .... |
| 0° | 1̄8̄0̄° | | | | | | 1 | | 3 | | 5 | 7  9 .... |
| 0° | 90° | 180° | 270° | | | 0 | | | | 4 | | 8 .... |
| 0° | 9̄0̄° | 180° | 2̄7̄0̄° | | | | | 2 | | | | 6 .... |
| 0° | 6̄0̄° | 120° | 1̄8̄0̄° | 240° | 3̄0̄0̄° | | | | 3 | | | 9 .... |
| Random | | | | | | 0 | | | | | | |

*values having a bar are to be subtracted in forming the linear combinations.

In particular one observes that the zero quantum transition may be uniquely selected by addition of an indefinite number of signal functions $S(t_1, t_2, \phi)$ where these functions are randomly distributed in the value of the phase variable. The number of different signal functions will influence the extent to which orders, other than zero, will cancel. Thus, the number of randomly distributed phases required to suppress the higher order transitions cannot be estimated apart from specific experimental conditions and desired amplitude of the spectral peaks above background.

The method of selection via linear combination of phase shifted initial conditions was tested for a weakly coupled three-spin ½ system consisting of the aromatic protons of 2-furancarboxylic acid methylester. For this system, $\Delta = 3$, and to completely separate each order of transition would require suitable linear combinations of experiments yielding $M(t_1, t_2, \phi)$ for $\phi = 0°, 60°, 120°, 180°, 240°$ and $300°$. Utilizing instead, only two phases, 0° and 180°, and treating resulting data as additive, the two dimensional spectrum of FIG. 2 is obtained. For experimental convenience, the middle doublet of two quantum transitions has been folded at the Nyquist frequency (here, 88.2 Hz.).

The spectrum of FIG. 2 was obtained using the excitation technique resulting in statistical non-equilibrium states of the second kind, following the pulse sequence of FIG. 1 with set (a) of pulse parameters. A first nonselective 90° pulse 1 was followed after a delay $\tau = 520$ ms by a second nonselective 90° pulse 2. The period $t_1$ between pulse 2 and the 90° mixing pulse 3 assumed incremental values in the range from 0 to 2.9 s, this interval being digitized to 512 equal increments. The free induction decay was recorded in the interval $t_2$ digitized with the same precision and range as $t_1$. The second "term" was obtained in precisely the same manner except for the phase of the preparative pulses 1 and 2 which now were each phased at 270° thereby producing the required 180° shift with respect to pulse 3, a 90° pulse. Addition of the two phases of data, will lead exclusively to zero and two quantums transitions in accord with Table I for the sample under study. This superposition of the data requires 512 pairs of data, M ($t_1$, $t_2$, 90°) and M ($t_1$, $t_2$, 180°) corresponding to each of the 512 values of $t_1$. After two dimensional Fourier transformation to the frequency domain, there results the two dimensional spectrum of the desired MQTs. It is apparent that the data could also be acquired and processed separately for each phase and subsequently transformed and combined to obtain the result of FIG. 2.

For the data of FIG. 2, the transitions corresponding to the selection rules $\Delta M = 0$ and $\Delta M = \pm 2$ are described by off-diagonal elements of the density operator which oscillate in time with their characteristic frequencies during the period $t_1$ and are then transformed into observable magnetization by the mixing pulse 3 and detected at the single quantum transition frequencies during the period $t_1$. Thus, the coordinates of the peaks in the two-dimensional spectrum are given along the $\omega_1$ axis by zero and two quantum transition frequencies and along the $\omega_2$ axis by the allowed single quantum transition frequencies. In the present instance only zero and two quantum transition frequencies are desired and these are most conveniently selected by projection onto the $\omega_1$ axis. The projection, appearing at the top of the two dimensional spectrum of FIG. 2 clearly exhibits the 6 zero quantum transitions and 6 two quantum transition frequencies which are expected for a three-spin system. One also observes that the zero quantum transitions are noticeably narrower than the two quantum transitions.

Figure 3:
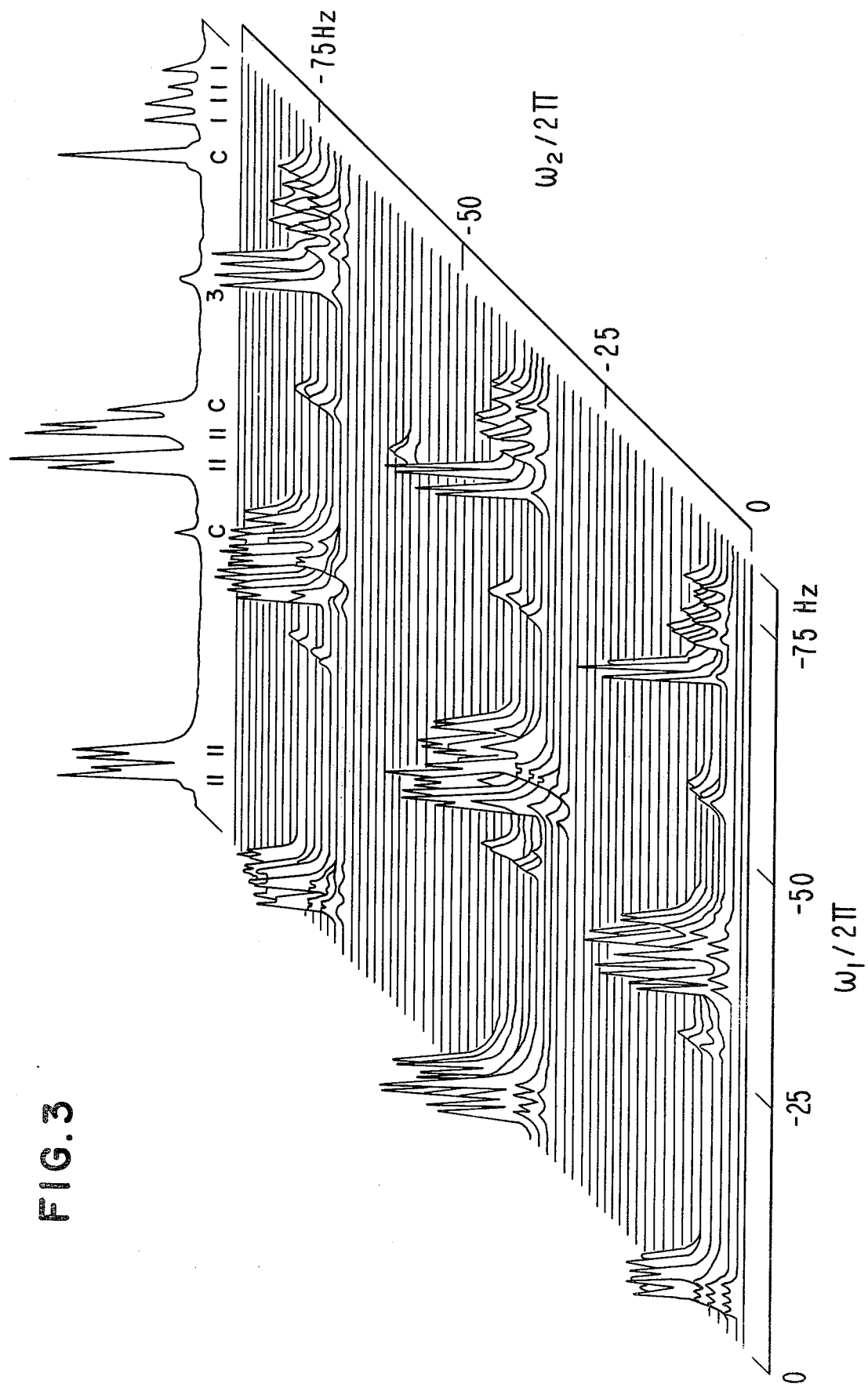
FIG. 3 is the two dimensional spectrum of single quantum and 3 quantum transitions in the AMX system of FIG. 1.

The experiment above described corresponds to the second entry of Table I. The selection corresponding to the third entry of Table I can be obtained easily wherein the abovedescribed experiment is modified only by a substractive superposition of the two "terms". That is, the 180° phase shifted data is subtracted from the 0° data to obtain, in accord with Table I, single and three quantum transitions. The resulting two dimensional spectrum is shown in FIG. 3 together with a projection on the $\omega_1$ axis. It is remarkable that all possible 15 single quantum transitions are observed in the projection whereas the conventional one dimensional spectrum exhibits only 12 lines. These corresponding 12 spectral peaks are labelled by the numeral 1 in the projection of FIG. 3 and three additional spectral peaks, labelled by C are here resolved. These 3 additional frequencies correspond to the combination lines $$\alpha\alpha\beta \rightarrow \beta\beta\alpha$$

$$\alpha\beta\alpha \rightarrow \beta\alpha\beta$$

$$\beta\alpha\alpha \rightarrow \alpha\beta\beta$$

which transitions have vanishing intensity in a conventional single parameter experiment but are here excited with relatively high intensity by means of the described two-pulse preparation. The peak of the projected spectrum labelled by the numeral 3 corresponds to a three quantum transition and exhibits a threefold inhomogeneous line width as expected from the discussion below.

SENSITIVITY OF MULTIPLE QUANTUM TRANSITIONS TO MAGNETIC FIELD INHOMOGENEITY

Another embodiment of the method of the present invention distinguishes among various orders of multiple quantum transitions. This embodiment is founded upon the differing sensitivity of such matrix elements to magnetic field inhomogeneity. Denoting the local field by $B(x) = B_0 + \Delta B(x)$, one obtains for the evolution of the density operator of a homonuclear spin system the expression $$\sigma(t) = \exp\{-iH_0 t + i\gamma \sum_k (1 - \sigma_k) I_{kz} \Delta B(x)\} \sigma(o)$$

$$\exp\{+iH_0 t - i\gamma \sum_k (1 - \sigma_k) I_{kz} \Delta B(x)\}$$

for $\Delta B(x) << B_0$, it is possible to a good approximation to neglect $\sigma_k$ thereby obtaining the expression $$\sigma_{(t)} = e^{-iH_0 t} e^{i\gamma F_z \Delta B(x)} \sigma_{(o)} e^{-i\gamma F_z \Delta B(x)} e^{iH_0 t}$$

$$= e^{-iH_0 t} \sum_{p=-\Delta}^{\Delta} \sigma_p(o) e^{i\gamma p \Delta B(x)} e^{iH_0 t}$$

This expression suggests that the sensitivity of multiple quantum transitions to magnetic field inhomogeneity exhibits dependence upon the order, p, of the particular multiple quantum transition. In contrast, zero quantum transitions characterized by p = 0 are substantially insensitive to magnetic field inhomogeneity. It is therefore possible to observe with high resolution zero quantum transitions in inhomogeneous magnetic fields and to defocus all other precessing magnetization components by application of a magnetic field gradient during the evolution period. The results of a particularly simple experiment for the selective recording of zero quantum transitions based on the insensitivity of these transitions to magnetic field inhomogeneity is in FIG. 4. The sample is identical to that of FIGS. 2 and 3. A magnetic field gradient pulse is applied at the beginning of the evolution period thereby destroying all off diagonal elements of the density operator of order $p \neq 0$, such effect being obtained in less than 100 milliseconds. A two-dimensional spectrum obtained in this manner was projected on the $\omega_1$ axis to yield the zero quantum transition spectrum of FIG. 4. This spectrum is seen to contain the 6 zero quantum transitions of the AMX system while all other transitions have been effectively removed.

Numerous variations on the above-described method will occur to one skilled in the art. For example, magnetic field inhomogeneity may be employed for the comparative identification of several orders of multiple quantum transitions. In lieu of recording full two-dimensional spectra, projections or summations may be employed to select, record and display one dimensional spectra of particular interest.

Since many changes could be made in the above method and many apparently different embodiments of this invention could be made without departing from the scope thereof, it is intended that all matter contained in the above description or shown in the accompanying drawing shall be interpreted as illustrative and not in a limiting sense.

What is claimed is:

1. In a method of gyromagnetic resonance spectroscopy, performed on a sample comprising systems of gyromagnetic resonators, for selective detection of selected orders of multiple quantum transitions, the steps of
   (a) preparing a non-equilibrium statistical state of an assembly of said resonators;
   (b) permitting said non-equilibrium state to evolve for a period of time, $t_1$;
   (c) applying a mixing pulse, said mixing pulse being shifted in phase by an angle $\phi$ with respect to the phase of oscillation characterizing said prepared state of said resonators;
   (d) detecting and recording the free induction decay of said resonances over a period of time, $t_2$, after application of said mixing pulse;
   (e) changing said evolution period of time by an increment thereof and repeating steps a-e inclusive, whereby a function $s(t_1, t_2, \phi)$ is developed;
   (f) changing the value of said phase shift and repeating steps a-e inclusive;
   (g) forming a linear combination of recorded free induction decays corresponding to a given value of said first interval of time and different values of said phase shifts; and
   (h) double Fourier transforming said linearly combined free induction decays to the frequency domain.

2. The method of claim 1 wherein said step of preparing said state comprises irradiating said sample with radio frequency energy.

3. The method of claim 2 wherein said step of preparing a non-equilibrium state of said resonator comprises: irradiating said resonators with first and second 90° pulses of radio frequency energy, said pulses being separated in time by a period related to the inverse of precession frequency differences between representative multiple quantum transitions, whereby a non-equilibrium state of the second kind is created.

4. The method of claim 2 wherein said step of preparing a non-equilibrium state of said resonators comprises: irradiating said resonators with a selective 180° pulse of radio frequency energy, and irradiationg said resonator with a nonselective 90° pulse, whereby a non-equilibrium state of the first kind is created.

5. The method of claim 1 wherein said phase shift characterizing said prepared non-equilibrium state relative to said mixing pulse is selected to reproduce a Fourier decomposition in said two dimensional spectra in at least approximate accord with the series expansion $$R_y^{(p)}(t_1,t_2) = \frac{1}{2\Delta} \sum_{q=0}^{2\Delta-1} M_y(t_1,t_2,\frac{\pi q}{\Delta}) \cos(\frac{\pi q p}{\Delta})$$

$$I_y^{(p)}(t_1,t_2) = \frac{1}{2\Delta} \sum_{q=0}^{2\Delta-1} M_y(t_1,t_2,\frac{\pi q}{\Delta}) \sin(\frac{\pi q p}{\Delta})$$

wherein $\Delta$ is the maximum change in magnetic quantum number for said system of resonators and p is the order of said multiple quantum transitions.

6. The method of claim 5 wherein said approximation comprises terminating said series expansion when the summation index is at least greater than 1.

7. The method of claim 6 wherein said step of permitting said non-equlibrium state to evolve further comprises application of a magnetic field gradient pulse to said sample during at least a portion of said evolution period.

8. The method of identifying the order of multiple quantum transition occurring in gyromagnetic resonance spectroscopy of a sample comprising systems of gyromagnetic resonators, comprising the steps of
   (a) preparing a non-equilibrium statistical state of an assembly of said resonators;
   (b) permitting said non-equilibrium state to evolve for a period of time;
   (c) applying a magnetic field gradient pulse during at least a portion of said evolution period;
   (d) applying a mixing pulse to said resonators;
   (e) sampling at least once after said mixing pulse the free induction decay signal of said resonances and recording said sample;
   (f) changing said evolution period of time by an increment thereof and repeating steps (a) through (e) inclusive whereby a signal function is developed, said signal function dependent upon the duration of said evolution period and the sampling time interval between said mixing pulse and said sample;
   (g) Fourier transforming said signal function in at least said evolution time parameter whereby a distribution function is obtained over at least the frequency domain corresponding to said evolution time domain.

9. The method of claim 8 wherein a plurality of samples are obtained and recorded, said signal function dependence on said sampling time if Fourier transformed to the frequency domain and said transformed signal function is exhibited in two dimensions.

10. The method of claim 8 wherein a parameter characterizing the degree of magnetic field inhomogeneity is systematically varied, whereby said signal function exhibits dependence upon said parameter.

11. The method of claim 10 wherein said transformed signal function is exhibited as a two dimensional distribution, one axis of said two dimensional distribution being representative of said parameter of magnetic field inhomogeneity.

* * * * *